United States Patent [19]

Meier et al.

[11] Patent Number: 5,565,500
[45] Date of Patent: Oct. 15, 1996

[54] CATIONICALLY POLYMERIZABLE MIXTURES CONTAINING SELECTED METALLOCENE COMPLEX SALTS AS CURING AGENTS

[75] Inventors: Kurt Meier, Binningen, Switzerland; Roger P. Salvin, Weil am Rhein, Germany

[73] Assignee: Ciba-Geigy Corporation, Tarrytown, N.Y.

[21] Appl. No.: 310,452

[22] Filed: Sep. 22, 1994

Related U.S. Application Data

[62] Division of Ser. No. 46,350, Apr. 8, 1993, Pat. No. 5,371,259, which is a continuation of Ser. No. 759,094, Sep. 6, 1991, abandoned, which is a continuation of Ser. No. 549,518, Jul. 6, 1990, abandoned, which is a division of Ser. No. 202,739, Jun. 3, 1988, Pat. No. 4,957,946.

[30] Foreign Application Priority Data

May 6, 1987 [CH] Switzerland .................. 2147/87

[51] Int. Cl.$^6$ .................. C08G 59/18; C08F 2/50; C08F 16/18; C08F 18/04
[52] U.S. Cl. .................. 522/59; 522/170; 522/178; 522/179; 522/181; 522/182; 522/67; 522/66; 528/90; 528/92; 528/412; 528/280; 526/171
[58] Field of Search .................. 522/66, 170, 146, 522/59, 181, 178, 182, 179, 67; 528/90, 92, 412, 280; 526/171

[56] References Cited

U.S. PATENT DOCUMENTS

| | | | |
|---|---|---|---|
| 4,108,747 | 8/1978 | Crivello | 522/31 |
| 4,250,053 | 2/1981 | Smith | 522/25 |
| 4,837,124 | 6/1989 | Wu | 522/31 |
| 4,957,946 | 9/1990 | Meier et al. | 522/59 |
| 5,124,233 | 6/1992 | Meier | 430/280 |

FOREIGN PATENT DOCUMENTS

| | | |
|---|---|---|
| 094915 | 11/1983 | European Pat. Off. . |
| 0109851 | 5/1984 | European Pat. Off. .................. 522/66 |
| 126712 | 11/1984 | European Pat. Off. . |
| 152377 | 2/1985 | European Pat. Off. . |
| 265373 | 4/1988 | European Pat. Off. . |

OTHER PUBLICATIONS

Journal of Organic Chemistry of the USSR translated, vol. 14, No. 6 1978 pp. 1222–1224.
Journal of Organic Chemistry of the USSR translated vol. 14, No. 5, 1978 pp. 985–988.
Nouveau Journal De Climie, vol. 8, No. 6 1984 p. 381–385.
Inorg. Chem. 1984 vol. 23 pp. 2633–2640.
J. L. Schrenk, et al, "Solvent and Ion–Pairing Effects on the Photochemical Arene Replacement Reactions of [(n$^5$–C$_5$H$_5$)Fe(7$^6$–p–xyl)]$^+$(p–xyl=p–xylene)", *Inorg. Chem.* 22, 4047–4049, 1983.

*Primary Examiner*—Susan W. Berman
*Attorney, Agent, or Firm*—William A. Teoli, Jr.; David R. Crichton

[57] ABSTRACT

The invention relates to mixtures containing:
a) a cationically polymerizable compound and
b) a compound of the formula I $$[R^1(Fe^{II}R^2)_a]_q^{\oplus an} \text{an} X^{\ominus q} \qquad (I)$$

in which a is 1 or 2, n is 1 or 2, $R^1$ is a substituted or unsubstituted π-arene, $R^2$ is a substituted or unsubstituted π-arene or cyclopentadienyl anion or indenyl anion, q is an integer from 1 to 3 and X is $FSO_3^-$ or a q-valent anion of an organic sulfonic acid or of a carboxylic acid; $R^1$ can also be a polymeric, aromatic ligand. The invention also relates to the novel compounds of the formula I. The curable mixtures can be processed in particular for the production of coatings having a good resistance to heat.

3 Claims, No Drawings

CATIONICALLY POLYMERIZABLE MIXTURES CONTAINING SELECTED METALLOCENE COMPLEX SALTS AS CURING AGENTS

This is a divisional of Ser. No. 08/046,350, filed Apr. 8, 1993, now U.S. Pat. No. 5,371,259, which is a continuation of Ser. No. 07/759,094, filed Sep. 6, 1991, now abandoned which is a continuation of Ser. No. 07/549,518, filed Jul. 6, 1990 now abandoned which is a divisional of Ser. No. 07/202,739 filed Jun. 3, 1988 now U.S. Pat. No. 4,957,946.

The invention relates to cationically polymerizable mixtures containing selected curing agents, novel curing agents for cationically polymerizable materials, and activated, polymerizable mixtures and to the use of these mixtures for the production of coatings.

The use of metallocene complex salts as curing agents for material which can be polymerized by cations and/or by free radicals is known per se.

Curable mixtures containing cationically polymerizable materials, preferably epoxide resins, and metallocene complex salts as curing agents are described in EP-A 94,915 and 109,851.

Combinations of material which can be polymerized by cations and/or free radicals, an iron-arene complex salt and an oxidizing agent are known from EP-A 126,712.

EP-A 152,377 describes combinations of material which can be polymerized by cations and/or free radicals, selected iron-arene complex salts, sensitizers and, if appropriate, oxidizing agents.

In all these publications complex halides are suggested as anions of the metallocene complex salt. Examples of these are $BF_4^-$, $PF_6^-$, $AsF_6^-$ and $SbF_6^-$.

Combinations of materials which can be polymerized by free radicals, selected iron-arene complex salts and a photoinitiator of the α-cleaver type are known from EP-A 221,010. According to this text, the anion of the iron-arene complex salts is selected from the group consisting of halogen, nitrate, sulfate, phosphate, perchlorate or a complex halide.

Problems can occur when mixtures containing solid or highly viscous epoxide resins and metallocene complex salts containing complex metal or non-metal halide anions are cured, since the curing agents are generally very reactive and can produce an inhomogeneous density of crosslinking. This then becomes evident by the formation of bubbles in the cured product during the soldering process, and use as a solder-stop lacquer is usually no longer possible. In such cases, therefore, the curing conditions must be controlled very carefully.

Furthermore, there is in the electronics sector a trend towards products containing as little as possible free or hydrolysable halogen. It would therefore be desirable if, in addition to curing agents containing complex metal or non-metal halide anions from which halogen can be split off by hydrolysis, there were also available further compounds which are less sensitive to hydrolysis and have a high reactivity comparable with that of the previously known curing agents.

High glass transition temperatures in the cured product are demanded for a number of applications; for example when it is used as a solder-stop lacquer, in which good resistance to heat is required. A selected class of curing agents which, in combination with cationically polymerizable compounds, produce curable mixtures having the advantages mentioned above have now been found.

The present invention relates to mixtures containing a) a cationically polymerizable compound and
b) a compound of the formula I

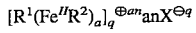   (I)

in which a is 1 or 2, n is 1 or 2, $R^1$ is a substituted or unsubstituted π-arene, $R^2$ is a substituted or unsubstituted π-arene or cyclopentadienyl anion or indenyl anion, q is an integer from 1 to 3 and X is $FSO_3^-$ or a q-valent anion of an organic sulfonic acid or carboxylic acid, subject to the proviso that $R^1$ can also be a polymeric, aromatic ligand and that in such a case a is a number corresponding to the average number of complexed groups in the polymer ligand.

Examples of components a) which can be employed within the scope of this invention are A) cationically polymerizable, ethylenically unsaturated compounds, B) cationically polymerizable, heterocyclic compounds and C) methylol compounds.

Examples of compounds of this type are to be found in EP-A 94,915.

Preferred components a) are cationically polymerizable, heterocyclic compounds, vinyl esters and vinyl ethers. Divinyl ethers of $C_2$–$C_{12}$ aliphatic diols and of polyethylene glycols or polypropylene glycols and also of dimethylolcyclohexanes are preferred.

Examples of compounds of this type are the divinyl ethers of ethylene glycol, trimethylene-1,3-diol, 1-methylpropane-1,3-diol, octamethylene-1,8-diol, diethylene glycol, triethylene glycol, tetramethylene-1,4-diol, HO–(CH$_2$)$_2$O–(CH$_2$)$_4$-O–(CH$_2$)$_2$OH and bis-1,4-methylolcyclohexane.

Components a) which are particularly preferred are epoxide resins, in particular those containing at least two 1,2-epoxide groups in the molecule. These compounds include, for example, the following:

I) Polyglycidyl and poly-(β-methylglycidyl) esters which can be obtained by reacting a compound having at least two carboxyl groups in its molecule and epichlorohydrin or glycerol dichlorohydrin or β-methylepichlorohydrin. The reaction is advantageously carried out in the presence of bases.

Aliphatic polycarboxylic acids can be used as the compound having at least two carboxyl groups in its molecule. Examples of these polycarboxylic acids are oxalic acid, succinic acid, glutaric acid, adipic acid, pimelic acid, suberic acid, azelaic acid, sebacic acid or dimerized or trimerized linoleic acid.

It is also possible, however, to employ cycloaliphatic polycarboxylic acids, for example tetrahydrophthalic acid, 4-methyltetrahydrophthalic acid, hexahydrophthalic acid or 4-methylhexahydrophthalic acid.

Aromatic polycarboxylic acids can also be used, for example phthalic acid, isophthalic acid or terephthalic acid.

II) Polyglycidyl or poly-(β-methylglycidyl) ethers which can be obtained by reacting a compound having at least two free alcoholic hydroxyl groups and/or phenolic hydroxyl groups and a suitably substituted epichlorohydrin under alkaline conditions or in the presence of an acid catalyst with subsequent treatment with alkali.

Ethers of this type are derived, for example, from acyclic alcohols, such as ethylene glycol, diethylene glycol and higher poly-(oxyethylene) glycols, propane-1,2-diol or poly-(oxypropylene) glycols, propane-1,3-diol, butane-1,4-diol, poly-(oxytetramethylene) glycols, pentane-1,5-diol, hexane-1,6-diol, hexane-2,4,6-triol, glycerol, 1,1,1-trimethylolpropane, pentaerythritol, sorbitol and polyepichlorohydrins.

They are, however, also derived, for example, from cycloaliphatic alcohols, such as 1,3-dihydroxycyclohexane, 1,4-dihydroxycyclohexane, bis-(4-hydroxycyclohexyl)-methane, 2,2-bis-(4-hydroxycyclohexyl)-propane or 1,1-bis-(hydroxymethyl)-cyclohex-3-ene.

The epoxide compounds can also be derived from mononuclear phenols, for example resorcinol or hydroquinone; or they are based on polynuclear phenols, for example bis-(4-hydroxyphenyl)-methane, 4,4'-dihydroxybiphenyl, bis-(4-hydroxyphenyl) sulfone, 1,1,2,2-tetrakis-(4-hydroxyphenyl)-ethane, 2,2-bis-(4-hydroxyphenyl)-propane and 2,2-bis-(3,5-dibromo-4-hydroxyphenyl)-propane and also on novolacs which can be obtained by condensing aldehydes, for example formaldehyde, acetaldehyde, chloral or furfuraldehyde, with phenols, such as phenol or phenols which are substituted in the nucleus by chlorine atoms or $C_1$–$C_9$ alkyl groups, for example 4-chlorophenol, 2-methylphenol or 4-tert-butylphenol, or which can be obtained by condensation with bisphenols as described above.

III) Poly-(S-glycidyl) compounds, in particular di-S-glycidyl derivatives derived from dithiols, for example ethane-1,2-dithiol or bis-(4-mercaptomethylphenyl) ether.

IV) Cycloaliphatic epoxide resins, such as bis-(2,3-epoxycyclopentyl) ether, 2,3-epoxycyclopentyl glycidyl ether or 1,2-bis-(2,3-epoxycyclopentyloxy)-ethane or 3,4-epoxycyclohexylmethyl 3',4'-epoxycyclohexanecarboxylate.

It is also possible, however, to use epoxide resins in which the 1,2-epoxide groups are attached to different heteroatoms or functional groups; these compounds include, for example, the glycidyl ether/glycidyl ester of salicylic acid.

If desired, a mixture of epoxide resins can be used in the mixtures according to the invention.

Cationically polymerizable compounds which are very particularly preferred are highly viscous or, in particular, solid epoxide resins, for example solid diglycidyl ethers based on bisphenol or glycidylated phenol novolacs or cresol novolacs. These are to be understood as meaning, in general, compounds which, in the uncured state, have a glass transition temperature higher than 0° C.

Examples of these are solid diglycidyl ethers based on bisphenol F and particularly on bisphenol A and glycidylated phenol/formaldehyde novolacs or o-cresol/formaldehyde novolacs.

Within the scope of this description π-arene $R^1$ and $R^2$ is to be understood as meaning a π-ligand of the Fe-II central atom, it being possible for this ligand to be a carbocyclic-aromatic group or a heterocyclic-aromatic group.

Suitable π-arenes $R^1$ and $R^2$ are, in particular, carbocyclic aromatic groups having 6 to 24 carbon atoms or heterocyclic-aromatic (heteroaromatic) groups having 3 to 30 carbon atoms, it being possible for these groups, if appropriate, to be monosubstituted or polysubstituted by identical or different monovalent radicals, such as halogen atoms, preferably chlorine or bromine atoms, or by $C_1$–$C_8$ alkyl, $C_1$–$C_8$ alkoxy, cyano, $C_1$–$C_8$ alkylthio, $C_2$–$C_6$ monocarboxylic acid alkyl ester, phenyl, $C_2$–$C_5$-alkanoyl or benzoyl groups. These π-arene groups can be mononuclear, condensed polynuclear or non-condensed polynuclear systems, it being possible in the systems last mentioned for the nuclei to be attached direct or via bridge members, such as —S— or —O—.

$R^2$ can also be an indenyl anion and, in particular, a cyclopentadienyl anion, it being also possible for these anions, if appropriate, to be monosubstituted or polysubstituted by identical or different monovalent radicals, such as $C_1$–$C_8$ alkyl, $C_2$–$C_6$ monocarboxylic acid alkyl ester, cyano, $C_2$–$C_5$ alkanoyl or benzoyl groups.

In this regard the alkyl, alkoxy, alkylthio, monocarboxylic acid alkyl ester and alkanoyl substituents can be linear or branched. Typical alkyl, alkoxy, alkylthio, monocarboxylic acid alkyl ester or alkanoyl substituents which may be mentioned are methyl, ethyl, n-propyl, isopropyl, n-butyl, sec-butyl, tert-butyl, n-pentyl, n-hexyl and n-octyl, methoxy, ethoxy, n-propoxy, tsopropoxy, n-butoxy, n-hexyloxy and n-octyloxy, methylthio, ethylthio, n-propylthio, isopropylthio, n-butylthio, n-pentylthio and n-hexylthio, carboxylic acid methyl, ethyl, n-propyl, isopropyl, n-butyl and n-pentyl esters and acetyl, propionyl, butyryl and valeroyl. In this regard alkyl, alkoxy, alkylthio and monocarboxylic acid alkyl ester groups having 1 to 4, especially 1 or 2, carbon atoms in the alkyl moieties and alkanoyl groups having 2 to 3 carbon atoms are preferred. Preferred substituted π-arenes or substituted indenyl or cyclopentadienyl anions are those containing one or two of the abovementioned substituents, in particular methyl, ethyl, n-propyl, isopropyl, methoxy or ethoxy groups.

$R^1$ and $R^2$ can be identical or different π-arenes. In addition, $R^1$ can also be a polymeric ligand having aromatic radicals.

As an aromatic, polymeric ligand, $R^1$ is preferably a polymer having carbo-cyclic-aromatic radicals. Polystyrene and copolymers of polystyrene with butadiene and poly-α-methylstyrene are preferred. The molecular weights of the polymer ligands vary within the scope of the polymers customarily obtainable. For polystyrene the molecular weights are usually between $10^5$ and $10^6$. As a rule, 1–50 mol % of the aromatic groups, relative to the total number per polymer molecule, are complexed with $Fe^{II}$. In such cases $R^2$ is preferably the cyclopentadienyl anion. The number a corresponds in the case of polymeric ligands to the average number of radicals of a polymer molecule which are complexed by $Fe^{II}$. Preferred ligands $R^1$ are monomeric π-arenes.

Suitable heteroaromatic π-arenes are, in particular, systems containing one or two S, N and/or O atoms.

Heteroaromatic π-arenes containing one or two S and/or O atoms are preferred.

Examples of suitable π-arenes are benzene, toluene, xylenes, ethylbenzene, cumene, methoxybenzene, ethoxybenzene, dimethoxybenzene, p-chlorotoluene, m-chlorotoluene, chlorobenzene, bromobenzene, dichlorobenzene, trimethylbenzene, trimethoxybenzene, naphthalene, 1,2-dihydronaphthalene, 1,2,3,4-tetrahydronaphthalene, methylnaphthalene, methoxynaphthalene, ethoxynaphthalene, chloronaphthalene, bromonaphthalene, biphenyl, stilbene, indene, 4,4'-dimethylbiphenyl, fluorene, phenanthrene, anthracene, 9,10-dihydroanthracene, triphenyl, pyrene, perylene, naphthacene, coronene, thiophene, chromene, xanthene, thioxanthene, benzofuran, benzothiophene, naphthothiophene, thianthrene, diphenylene oxide, diphenylene sulfide, acridine and carbazole.

Examples of anions of substituted cyclopentadienes are the anions of methylcyclopentadiene, ethylcyclopentadiene, n-propylcyclopentadiene and n-butylcyclopentadiene, and the anions of dimethylcyclopentadiene, methyl cyclopentadienecarboxylate, ethyl cyclopentadienecarboxylate, acetylcyclopentadiene, propionylcyclopentadiene, cyanocyclopentadiene and benzoylcyclopentadiene. Preferred anions are the anion of unsubstituted indene and, in particular, the anion of unsubstituted cyclopentadiene.

If a is 2, $R^2$ is in each case preferably the substituted or unsubstituted indenyl anion or, in particular, cyclopentadienyl anion.

$X^{\ominus q}$ is $FSO_3^-$ or, preferably, the q-valent anion of an organic sulfonic acid or carboxylic acid. These are to be understood very generally as meaning an aliphatic, cycloaliphatic, carbocyclic-aromatic, heterocyclic-aromatic or araliphatic sulfonic or carboxylic acid.

The anions can be substituted or unsubstituted. Sulfonic or carboxylic acids having a slight nucleophilic character, for example partly fluorinated or perfluorinated derivatives or derivatives substituted in a position adjacent to the particular acid group, are preferred.

Examples of substituents are halogen, such as chlorine and especially fluorine, alkyl, such as methyl, ethyl or n-propyl, or alkoxy, such as methoxy, ethoxy or n-propoxy.

Examples of aliphatic sulfonic acids are methanesulfonic, ethanesulfonic, n-propanesulfonic, n-butanesulfonic and n-hexanesulfonic acid or the correspondingly partly fluorinated or perfluorinated derivatives.

Examples of aliphatic carboxylic acids are formic acid, acetic acid, propionic acid, butyric acid, pivalic acid, caproic acid, 2-ethylhexylcarboxylic acid, and fatty acids, such as lauric acid, myristic acid or stearic acid, and also the partly fluorinated or perfluorinated derivatives of these acids.

Examples of cycloaliphatic sulfonic or carboxylic acids are cyclohexanesulfonic acid, cyclohexanecarboxylic acid, camphor-10-sulfonic acid or the partly fluorinated or perfluorinated derivatives thereof.

Examples of carbocyclic-aromatic sulfonic acids are benzenesulfonic, toluenesulfonic, ethylbenzenesulfonic, isopropylbenzenesulfonic, dodecylbenzenesulfonic or dimethylbenzenesulfonic acid, 2,4,6-triisopropylbenzenesulfonic acid, 2,4,6-trimethylbenzenesulfonic acid, naphthalenesulfonic acid, naphthalenedisulfonic acids or naphthalenetrisulfonic acids and the corresponding alkylated or partly fluorinated or perfluorinated derivatives of these sulfonic acids.

Examples of heterocyclic-aromatic sulfonic acids are pyridinesulfonic, thiophenesulfonic or pyrrolesulfonic acid and the corresponding partly fluorinated or perfluorinated derivatives of these acids.

Examples of araliphatic sulfonic acids are benzylsulfonic acid, α-methylbenzylsulfonic acid and the corresponding partly fluorinated or perfluorinated derivatives of these compounds.

Examples of carbocyclic-aromatic carboxylic acids are benzoic acid, toluenecarboxylic, ethylbenzenecarboxylic, isopropylbenzenecarboxylic or dimethylbenzenecarboxylic acid, naphthalenecarboxylic acid or anthracenecarboxylic acid and the corresponding partly fluorinated or perfluorinated derivatives of these compounds.

Examples of heterocyclic-aromatic carboxylic acids are pyridinecarboxylic, thiophenecarboxylic or pyrrolecarboxylic acid and the corresponding partly fluorinated or perfluorinated derivatives of these compounds.

Examples of araliphatic carboxylic acids are benzylcarboxylic acid, α-methylbenzylcarboxylic acid and cinnamic acid, and also the corresponding partly fluorinated or perfluorinated derivatives of these compounds.

$X^{\ominus q}$ is preferably the monovalent anion of an organic sulfonic acid, especially a partly fluorinated or perfluorinated sulfonic acid. These anions are distinguished by a particularly slight nucleophilic character.

Preferred mixtures are those in which component b) is a compound of the formula I and $X^{\ominus q}$ is a monovalent anion of an aliphatic, partly fluorinated aliphatic or perfluorinated alphatic sulfonic acid or of an aromatic, partly fluorinated aromatic or perfluorinated aromatic sulfonic acid.

Mixtures in which component b) is a compound of the formula I and $X^{\ominus q}$ is selected from the group consisting of $CF_3SO_3^-$, $C_2F_5SO_3^-$, $n\text{-}C_3F_7SO_3^-$, $n\text{-}C_4F_9SO_3^-$, $n\text{-}C_4F_9SO_3^-$, $n\text{-}C_6F_{13}SO_3^-$, $n\text{-}C_8F_{17}SO_3^-$ and $C_6F_5SO_3^-$ are particularly preferred.

Curable mixtures containing, as the component b) a compound of the formula Ia

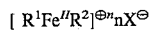     (Ia)

in which $R^1$ is a π-arene, $R^2$ is a π-arene or a cyclopentadienyl anion, n is as defined above and $X^-$ is an anion of an organic sulfonic acid are preferred.

Curable mixtures which are particularly preferred, contain, as the component b), a compound of the formula I or Ia in which $R^1$ is selected from the group consisting of toluene, xylene, ethylbenzene, cumene, methoxybenzene, methylnaphthalene, methoxynaphthalene, pyrene, perylene, stilbene, diphenylene oxide and diphenylene sulfide, $R^2$ is a cyclopentadienyl anion and $X^-$ is a perfluoroalkylsulfonate or perfluorophenylsulfonate.

Other preferred mixtures contain, as the component a), a solid epoxide resin and, as the component b), a compound of the formula Ia in which $R^1$ is selected from the group consisting of toluene, xylene, ethylbenzene, cumene, methoxybenzene, methylnaphthalene, methoxynaphthalene, pyrene, perylene, stilbene, diphenylene oxide and diphenylene sulfide, $R^2$ is a cyclopentadienyl anion and $X^\ominus$ is a perfluoroalkylsulfonate or a perfluorophenylsulfonate, but particularly a trifluoromethanesulfonate or a nonafluorobutanesulfonate.

With the exception of 1,4-dimethylbenzene-cyclopentadienyl-iron-(II) trifluoromethanesulfonate and 9,9-dimethylfluorene-cyclopentadienyl-iron-(II) fluosulfonate, the compounds of the formula I are novel. The previously known compounds are described in Inorg. Chem. 22, 4047 (1983) and 23, 2633 (1984) and in Nouv. J. Chim. 8(6), 381 (1984). These publications describe the photolyrically induced ligand exchange reaction at iron-arene complexes and the preparation of the compounds, but not their use as curing agents for cationically polymerizable materials.

The invention therefore also relates to the compounds of the formula I, with the exception of 1,4-dimethylbenzene-cyclopentadienyl-iron-(II) trifluoromethanesulfonate and 9,9-dimethylfluorene-cyclopentadienyliron(II) fluosulfonate.

The following are examples of particularly preferred compounds: (toluene) (cyclopentadienyl)-iron(II) trifluoromethanesulfonate, (ethylbenzene) (cyclopentadienyl)-iron(II) trifluoromethanesulfonate, (cumene)-(cyclopentadienyl)-iron(II) trifluoromethanesulfonate, (methoxybenzene)-(cyclopentadienyl)-iron(II) trifluoromethanesulfonate, (methylnaphthalene)-(cyclopentadienyl)-iron(II) trifluoromethanesulfonate, (methoxynapthalene) (cyclopentadienyl)-iron(II) trifluoromethanesulfonate, (pyrene)(cyclopentadienyl)-iron(II) trifluoromethanesulfonate, (perylene)(cyclopentadienyl)-iron(II) trifluoromethanesulfonate, (stilbene)(cyclopentadienyl-iron)(II) trifluoromethanesulfonate, (diphenylene oxide)(cyclopentadienyl)-iron(II)trifluoromethanesulfonate, (diphenylene sulfide)(cyclopentadienyl-iron(II) trifluoromethanesulfonate, (fluorene)(cyclopentadienyl)-iron(II) trifluoromethanesulfonate, and the corresponding nonofluorobutanesulfonates, tridecafluorohexanesulfonates, heptadecafluorooctanesulfonates, fluosulfonates, pentafluorophenylsulfonates and trifluoroacetates.

The materials employed as the component a) are known per se and are for the most part commercially available.

The compounds of the formula I are prepared analogously to known processes. The preparation of metallocene complexes of this type having complex halide anions is described, for example, in EP-A 94,915.

As a variation from the processes described therein, the compounds of the formula I can be prepared by introducing in a manner known per se an anion of the acid $H_qX$ instead of an anion of a complex halide; in this formula q and X are as defined earlier in the text.

The introduction of the anion can be effected, for example, by reacting a metallocene halide with an acid $H_qX$ or with a dissolved salt of such an acid.

The curable mixtures according to the invention are sensitive to light. They can be obtained in any desired form, for example as homogeneous liquid mixtures or in a homogeneous or inhomogeneous form. Homogeneous products can be obtained in a manner known per se, for example by liquefying solid polymerizable organic materials, if appropriate with the addition of suitable solvents in the dark or under red light, heating the materials to temperatures above their glass transition point, adding the initiator of the formula I and cooling the resulting mixtures. If desired, the products thus obtained can subsequently be comminuted. Inhomogeneous products can be obtained, for example, by mixing polymerizable materials in the form of powder with initiators according to the invention.

The curable mixtures according to the invention can be stored at room temperature for a considerable time in comparative darkness, for example in red light.

Depending on their composition and their end use, for example for the production of coatings or films, they can be cured by the direct application of heat. As a rule, the direct curing by heat is carried out at temperatures of 130°–220° C., in particular 150°–180° C. The temperatures for direct curing by heat are preferably close to the decomposition point of the initiator employed. It is preferable to employ initiators of the formula I in which $R^1$ is a condensed aromatic hydrocarbon in the direct curing by heat. Curing by heat is normally complete after about 3 to 10 minutes.

As used here, the expression "cure" means the conversion of the soluble, either liquid or meltable, cationically polymerizable compound into solid, insoluble and infusible, three-dimensionally crosslinked products. This is effected, as a rule, with simultaneous shaping to give shaped articles, impregnations, coatings or adhesive joints.

Two-stage polymerization (curing) is particularly preferred and is effected by first activating the initiator of the formula I by irradiating the curable mixture with actinic light and then curing by heat the resulting activated precursors, the temperature of irradiation being below the temperature used for the subsequent curing by heat. These activated precursors can normally be cured at temperatures which are considerably lower than the temperature required in the case of direct curing by heat, and are advantageously within the range from 80° to 180° C., preferably from 100° to 180° C. This two-stage curing also makes it possible to control the polymerization in a particularly simple and advantageous manner. In addition, the activated precursors obtainable from the curable mixtures according to the invention can be stored for a considerable time at room temperature, even in light, this applying particularly to mixtures containing a highly viscous or solid epoxide resin as the component a). This characteristic constitutes a further substantial advantage of two-stage curing and of these activated precursors. In general, activated precursors obtainable from liquid curable mixtures according to the invention have only a limited stability on storage in light and are advantageously processed further immediately.

The irradiation of the curable mixtures for the preparation of the activated precursors is advantageously effected by means of actinic light, preferably light of a wavelength from 200 to 600 nm. Examples of suitable light sources are xenon lamps, argon lamps, tungsten lamps, carbon arcs, metal halide lamps and metal arc lamps, such as low-pressure, medium-pressure and high-pressure mercury vapour lamps, or lasers, such as argon or krypton ion lasers. Irradiation is preferably carried out using metal halide lamps or high-pressure mercury vapour lamps and also with argon or krypton ion lasers. The irradiation time depends on various factors, including, for example, the polymerizable organic material, the nature of the light source and the distance of the latter from the irradiated material. The irradiation time is preferably 10 to 60 seconds.

The heating of the exposed compositions can be carried out in conventional convection ovens. If short heating or reaction times are necessary, the heating can be carried out by exposure to, for example, IR radiation, IR lasers or microwave devices.

In general, the curing temperature in direct curing by heat or in the thermal stage of two-stage polymerization is higher than that of mixtures containing the corresponding metallocene initiators having anions of complex metal or non-metal halides.

Although the curing agents of the formula I in the epoxide matrix are, as a rule, thus less reactive, in general a cured product is formed which has a higher glass transition temperature than when curing is carried out using the metallocene complexes containing complex halide anions.

Accordingly, the invention also relates to the cured product obtainable by i) the direct curing by heat of the curable mixture, as defined above, or ii) two-stage polymerization of the curable mixture, as defined above.

The invention also relates to activated, curable mixtures which are obtainable by irradiating with actinic light curable mixtures containing a cationically polymerizable organic material a) and at least one compound of the formula I at a temperature which is below the temperatures used for the subsequent curing by heat. What has been stated above in respect of the preferred cationically polymerizable materials and compounds of the formula I also applies here.

The curable mixtures and the activated precursors obtainable therefrom can also contain further additives which are known and are customarily employed in the technology of photopolymerizable materials.

Examples of such additives are pigments, dyes, fillers and reinforcing agents, such as glass fibres and other fibres, fire-retarding substances, antistatic agents, flow control agents, antioxidants and light stabilizers.

The mixtures according to the invention can, of course, also contain combinations of initiators of the formula I and sensitizers. Particularly in the case of compounds of the formula I in which $R^1$ is a substituted or unsubstituted benzene derivative an increase in the sensitivity to light is usually observed when sensitizers are added. Examples of suitable sensitizers are to be found in EP-A 152,377. Furthermore, combinations of initiators of the formula I, oxidizing agents and, if appropriate, sensitizers for the compounds I can also be employed in the mixtures according to the invention. As a rule, oxidizing agents reduce the curing temperatures and permit processing under mild conditions. Suitable oxidizing agents are mentioned in EP-A 126,712.

In order to increase their stability on storage in the dark, the curable mixtures and activated precursors can contain weak organic bases, such as nitriles, tertiary amines or urea derivatives. In order to prevent premature reaction caused by unintended exposure to light, small amounts of UV absorbants and/or organic dyes can be added.

The curable mixtures according to the invention and the activated precursors obtainable therefrom are preferentially suitable for the production of surface coatings on a variety of substrates.

It is very particularly preferred to use the curable mixtures having highly viscous or solid epoxide resins as the component a). In this embodiment the curable mixtures are preferably used as solder-stop masks. The present invention also relates to these uses.

Examples of suitable substrates are metals, such as aluminium, steel, cadmium, zinc and, preferably, copper, semiconductors, such as silicon, germanium or GaAs, ceramics, glass, plastics, paper or wood and especially metal-coated laminates such as are used for the production of printed circuit boards.

If initially only part of the coating is exposed imagewise in the two-stage polymerization described above, for example if it is irradiated through a mask, the unexposed areas can, after a subsequent brief curing by heat, be removed by means of a suitable solvent. The curable mixture according to the invention are thus suitable for the reproduction of images or for the production of printing plates and especially printed circuits (photoresists) by methods known per se (see, for example, British Patent Specification 1,495,746).

If, in the production of images, the light energy is minimized during the photostructuring, for example in the production of solder-stop masks by exposure to lasers, a multistage curing process can be recommended. In this process, the first step is the production of a structure, in the course of which the lowest possible radiation intensity can be employed, and subsequently this structure is subjected to after-treatment in order to improve its final properties.

The process comprises the following steps:

A) imagewise exposure to actinic light of a substrate coated with the composition according to the invention, B) heat-treating the system at an elevated temperature so that preliminary curing takes place in the irradiated portions of the surface, C) developing the system by treatment with a solvent so that the precured composition in the irradiated portions of the surface substantially remains on the substrate and is dissolved away in the non-irradiated portions of the surface, D) exposing the whole of the surface to actinic light, and E) subsequent heat treatment in order to complete the curing of the precured product.

The temperatures in steps B) and E) are preferably above 130° C. and the curing times in these steps are preferably more than 10 minutes in the case of step B) and more than 15 minutes in the case of step E). The radiation dosage in stage A) is preferably such that, in combination with step B), an adequate precuring just takes place, so that stage C) can be carried out without problems. The individual parameters in this combination can be determined by those skilled in the art by means of routine tests.

The mixtures according to the invention and the activated precursors obtainable therefrom can also be used as adhesives or for the production of putties, fillers or fibre-reinforced composite materials and laminated articles.

For the above applications, the curable compositions according to the invention or the activated precursors obtainable therefrom advantageously contain 0.1 to 15% by weight, preferably 0.5 to 5% by weight, relative to the polymerizable organic material a), of at least one compound of the formula I.

The following examples illustrate the invention.

A) Preparation of the Curing Initiators

EXAMPLE 1

($\eta^6$Cumene)($\eta^5$-cyclopentadienyl)-iron(II) trifluoromethanesulfonate

A mixture of 7.5 g of ferrocene, 0.27 g of aluminium, 5.4 g of aluminium chloride and 4.5 g of titanium tetrachloride in 35 ml of cumene is stirred for 2 hours at 100° C. The mixture is cooled to room temperature and poured into 20 ml of 32% hydrochloric acid/100 g of ice, stirred for 2 hours and then filtered. The aqueous, yellow-brown phase is separated off and 6 g of trifluoromethanesulfonic acid are added to it. The product is extracted with twice 50 ml of methylene chloride, the methylene chloride solution is washed once with 30 ml of 10% sodium bicarbonate solution and once with 50 ml of water, dried by adding 5 g of sodium sulfate, and filtered, and the methylene chloride is removed by evaporation. Recrystallization from methylene chloride/hexane affords 12.25 g (78.5% of theory) of the abovementioned complex: melting point 49° C.

EXAMPLE 2

($\eta^6$-Cumene) ($\eta^5$-cyclopentadienyl)-iron(II) nonafluorobutanesulfonate Prepared by the method described in Example 1, but employing 13.5 g of potassium nonafluorobutanesulfonate instead of trifluoromethanesulfonic acid. This gives 16.6 g (77% of theory) of the abovementioned complex: melting point 45.5° C.

EXAMPLE 3

($\eta^6$-Cumene) ($\eta^5$-cyclopentadienyl)-iron(II) pentafluorobenzenesulfonate Prepared by the method described in Example 1, but employing 10.8 g of sodium pentafluorobenzenesulfonate instead of trifluoromethanesulfonic acid. This gives 12.7 g (65% of theory) of the abovementioned complex: melting point 122° C.

EXAMPLE 4

($\eta^6$-Cumene) ($\eta^5$-cyclopentadienyl)-iron(II) trifluoroacetate

Prepared by the method described in Example 1, but employing 5.4 g of sodium trifluoroacetate instead of trifluoromethanesulfonic acid. This gives 9.7 g (68.5% of theory) of the abovementioned complex in the form of a dark brown oil having a decomposition point above 210° C.

EXAMPLE 5

($\eta^6$-Stilbene) ($\eta^5$-cyclopentadienyl)-iron(II) trifluoromethane-sulfonate A solution of 10 g of ($\eta^6$-stilbene) ($\eta^5$-cyclopentadienyl)-iron(II) hexafluorophosphate[1] and 3 g of aluminium chloride in 100 ml of methylene chloride is stirred under nitrogen for 1 hour. After 160 ml of water have been added the mixture is stirred for a further 30 minutes and the aqueous phase is then separated off in a separating funnel and 3.66 g of trifluoromethanesulfonic acid are added dropwise slowly. The precipitate formed is filtered off, rinsed with a little water and dried in vacuo at 50° C. This gives 4.24 g (42% of theory) of the abovementioned complex: melting point: 130° C.

[1] Prepared as in Example 2 of EP-A 207,889

EXAMPLE 6

($\eta^6$-Stilbene) ($\eta^5$-cyclopentadienyl)-iron(II) 4-toluenesulfonate

Prepared by the method described in Example 5, but employing 4.3 g of 4-toluenesulfonic acid instead of trifluoromethanesulfonic acid. This gives 3.64 g (34.4% of theory) of the abovementioned complex: melting point: 136° C.

EXAMPLE 7

($\eta^6$-1-Methylnaphthalene) ($\eta^5$-cyclopentadienyl)-iron(II) trifluoromethanesulfonate Prepared by the method described in Example 1, but employing 35 ml of 1-methylnaphthalene instead of cumene. This gives 10.8 g (72% of theory) of the abovementioned complex: melting point 78° C.

B) Use Examples

Examples I–III

General Working Instructions

Solutions consisting of 100 g of technical epoxide cresol novolac (epoxide value 4.5 equivalents/kg), 50 g of a technical bisphenol A diglycidyl ether (epoxide value 0.35 equivalents/kg), 30 g of talc (Cyprus), 2 g of Irgalithgrün (Ciba-Geigy), 180 g of cyclohexanone and the amount of photoinitiator (iron-arene complex) and sensitizer indicated in Table 1 are applied to a printed circuit board by means of a 100µ wire doctor-blade. The film, which is initially wet, is dried at 80° C. The board thus produced is exposed to a 5000-watt high-pressure mercury vapour lamp at a distance of 50 cm from the mask laid on it. The exposure time is 1 minute. The board is then precured for 10 minutes at 110° C. Development is carried out in cyclohexanone, the non-exposed portions (soldering lugs) are dissolved. The board is then post-cured for 30 minutes at 135° C. After being coated with flux, the board is finally immersed for 10 seconds in a bath of solder (lead-tin) heated to 270° C. and is then inspected (cf. Table 1).

Examples IV–VIII

General Working Instructions

Solutions according to Examples I–III and Table 2 are applied to copper foils 70µ thick by means of a 100µ wire doctor-blade. The film is dried for 30 minutes at 80° C. and is then exposed for 1 minute (see Examples I–III) and cured for 1 hour at 135° C.

The glass transition temperatures of the layers thus obtained are determined by thermomechanical analysis (Mettler, TMA 40 measuring cell) (cf. Table 2).

TABLE 1

| Example | Photoinitiator*) | Photoinitiator concentration [mmol] | Sensitizer | Sensitizer concentration [mmol] | Appearance after solder bath |
|---|---|---|---|---|---|
| I | [Cumene Fe Cp] CF$_3$SO$_3$ | 10 | Isopropylthioxanthone | 5 | No change |
| II | [Cumene Fe Cp] C$_4$F$_9$SO$_3$ | 10 | Isopropylthioxanthone | 5 | No change |
| III | [Stilbene Fe Cp] CF$_3$SO$_3$ | 10 | — | — | No change |

*)Cp = cyclopentadienyl anion

TABLE 2

| Example | Photoinitiator*) | Photoinitiator concentration [mmol] | Sensitizer | Sensitizer concentration [mmol] | Tg (°C.) |
|---|---|---|---|---|---|
| IV | [Cumene Fe CP] CF$_3$SO$_3$ | 10 | Isopropylthioxanthone | 5 | 137 |
| V | [Cumene Fe Cp] C$_4$F$_9$SO$_3$ | 10 | Isopropylthioxanthone | 5 | 140 |
| VI | [Cumene Fe Cp] C$_6$F$_5$SO$_3$ | 10 | Isopropylthioxanthone | 5 | 162 |
| VII | [Stilbene Fe CP] CF$_3$SO$_3$ | 10 | — | — | 143 |
| VIII | [Naphthalene Fe Cp] CF$_3$SO$_3$ | 10 | — | — | 140 |

What is claimed is:

1. A cured product obtained
   (i) by the direct curing by heat of a curable mixture which comprises
   (a) an epoxy resin, a vinyl ether or a vinyl ester, and
   (b) a compound of formula Ia

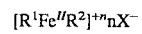
(Ia)

in which n is 1 or 2, $R^1$ is a π-arene, selected from the group consisting of toluene, xylene, ethylbenzene, cumene, methoxybenzene, methylnaphthalene, methoxynaphthalene, pyrene, perylene, stilbene, diphenylene oxide and diphenylene sulfide, $R^2$ is a cyclopentadienyl anion, and $X^-$ is an anion of a carbocyclic aromatic or heterocyclic aromatic sulfonic acid selected from the group consisting of benzenesulfonic, tolenesulfonic, ethylbenzenesulfonic, isopropylbenzenesulfonic, dodecylbenzenesulfonic or dimethylbenzenesulfonic acid, 2,4,6-triisopropylbenzenesulfonic acid, 2,4,6-trimethylbenzenesulfonic acid, naphthalenesulfonic acid, naphthalenedisulfonic acid, and naphthalenetrisulfonic acid, and the corresponding alkylated or partly fluorinated or perfluorinated derivatives thereof; pyridinesulfonic, thiophenesulfonic, and pyrrolesulfonic acid and the corresponding partly fluorinated or perfluorinated derivatives of these acids; or (ii) by irradiating a curable mixture, described above, with actinic light and subsequently curing by heat, the irradiation temperature being below that used for the subsequent curing by heat.

2. A product according to claim 1 wherein component (a) is a highly viscous or solid epoxide resin.

3. A product according to claim 1 wherein component (a) is a solid epoxide resin.

* * * * *